United States Patent
Ueda et al.

(10) Patent No.: US 9,849,613 B2
(45) Date of Patent: Dec. 26, 2017

(54) CONVEYING AND COOLING APPARATUS FOR A RESIN COMPOSITION AND CONVEYING AND COOLING METHOD FOR A RESIN COMPOSITION

(75) Inventors: Shigehisa Ueda, Tokyo (JP); Hiroshi Shibata, Tokyo (JP)

(73) Assignee: SUMITOMO BAKELITE COMPANY LIMITED, Tokyo (JP)

( * ) Notice: Subject to any disclaimer, the term of this patent is extended or adjusted under 35 U.S.C. 154(b) by 456 days.

(21) Appl. No.: 13/580,258

(22) PCT Filed: Feb. 21, 2011

(86) PCT No.: PCT/JP2011/053698
§ 371 (c)(1),
(2), (4) Date: Aug. 21, 2012

(87) PCT Pub. No.: WO2011/108387
PCT Pub. Date: Sep. 9, 2011

(65) Prior Publication Data
US 2012/0318002 A1    Dec. 20, 2012

(30) Foreign Application Priority Data
Mar. 5, 2010  (JP) .................................. 2010-049762

(51) Int. Cl.
*F25D 25/04*    (2006.01)
*B29C 43/22*    (2006.01)
(Continued)

(52) U.S. Cl.
CPC .............. *B29C 43/22* (2013.01); *B29B 13/04* (2013.01); *B29C 43/28* (2013.01); *B29C 47/004* (2013.01);
(Continued)

(58) Field of Classification Search
CPC . F25D 3/11; F25D 3/127; F25D 13/06; F25D 13/067; B29B 13/04; B29C 43/22;
(Continued)

(56) References Cited

U.S. PATENT DOCUMENTS 3,247,038 A * 4/1966 Kraft, Jr. ........................ 156/164
3,267,585 A * 8/1966 Futer ........................ A23L 3/361
                                                         156/497

(Continued)

FOREIGN PATENT DOCUMENTS

JP          5-43622 A      2/1993
JP          6-347162 A    12/1994
(Continued)

OTHER PUBLICATIONS

International Search Report issued in PCT/JP2011/053698 dated Mar. 15, 2011.
(Continued)

*Primary Examiner* — Mohammad M Ali
(74) *Attorney, Agent, or Firm* — Birch, Stewart, Kolasch & Birch, LLP (57) ABSTRACT

A cooling apparatus includes a conveying means which conveys a resin composition formed into a sheet shape along a direction parallel to a surface of the sheet-shaped resin composition and a cooling means which cools the resin composition being conveyed by the conveying means. A temperature of the resin composition just before being cooled by the cooling means is in the range of 40 to 60° C. and the cooling means has a cooling ability to cool the resin composition such that a cooling rate of the resin composition is in the range of 0.2 to 5° C./min. Further, the cooling means includes a fan section having at least one outlet port which discharges cooling air of which temperature is in the range of −40 to 0° C. to the resin composition.

14 Claims, 7 Drawing Sheets

(51) Int. Cl.
  *B29B 13/04* (2006.01)
  *B29C 47/00* (2006.01)
  *B29C 47/34* (2006.01)
  *B29C 47/88* (2006.01)
  *B29C 43/28* (2006.01)
  B29C 35/16 (2006.01)
  B29C 43/46 (2006.01)
  B29C 43/50 (2006.01)

(52) U.S. Cl.
  CPC .......... *B29C 47/0021* (2013.01); *B29C 47/34* (2013.01); *B29C 47/885* (2013.01); *B29C 47/8875* (2013.01); *B29C 2035/1658* (2013.01); *B29C 2043/468* (2013.01); *B29C 2043/5076* (2013.01); *H01L 2224/32245* (2013.01); *H01L 2224/48091* (2013.01); *H01L 2224/48465* (2013.01); *H01L 2224/73265* (2013.01)

(58) Field of Classification Search
  CPC ..... B29C 7/0021; B29C 47/34; B29C 47/885; B29C 47/8875; B29C 47/004; B29C 43/28; B29C 2043/468; B29C 2043/5076; B29C 2035/1658; H01L 2224/48465; H01L 2224/73265; H01L 2224/32245; H01L 2224/48091; H01L 2924/00014
  USPC .............................................. 62/63, 380, 374
  See application file for complete search history.

(56) References Cited

U.S. PATENT DOCUMENTS

| | | | | |
|---|---|---|---|---|
| 3,393,532 A | * | 7/1968 | Khoylian | .......................... 62/380 |
| 4,056,592 A | * | 11/1977 | Izumi et al. | .................. 264/141 |
| 4,923,658 A | * | 5/1990 | Hover et al. | ..................... 264/76 |
| 5,357,014 A | | 10/1994 | Uchida et al. | |
| 5,391,924 A | * | 2/1995 | Uchida et al. | ................. 257/789 |
| 6,148,618 A | * | 11/2000 | Malmberg et al. | ............... 62/63 |
| 6,815,070 B1 | * | 11/2004 | Burkle et al. | .............. 428/425.6 |
| 8,052,842 B2 | * | 11/2011 | Pittman | .................. B27N 1/029 |
| | | | | 162/225 |
| 8,101,108 B2 | * | 1/2012 | Otoshi | ...................... 264/211.23 |
| 2002/0028340 A1 | * | 3/2002 | Fujii | .................. B29C 47/0021 |
| | | | | 428/516 |
| 2002/0050325 A1 | * | 5/2002 | Avalos | .................. B05C 5/0254 |
| | | | | 156/583.1 |
| 2002/0192891 A1 | * | 12/2002 | Takata | .................... B29C 43/24 |
| | | | | 438/200 |
| 2004/0216470 A1 | * | 11/2004 | Thomas et al. | .................... 62/63 |
| 2004/0258881 A1 | * | 12/2004 | Takata | ................. B29C 55/023 |
| | | | | 428/137 |
| 2009/0316084 A1 | | 12/2009 | Yajima et al. | |

FOREIGN PATENT DOCUMENTS

| | | |
|---|---|---|
| JP | 9-155863 A | 6/1997 |
| JP | 9-204004 A | 8/1997 |
| JP | 2000-246732 A | 9/2000 |
| JP | 2000-246785 A | 9/2000 |
| JP | 2005-99097 A | 4/2005 |
| JP | 2006-187873 A | 7/2006 |
| JP | 2006-231549 A | 9/2006 |
| JP | 2006-264325 A | 10/2006 |
| JP | 2006-297701 A | 11/2006 |
| JP | 2007-190905 A | 8/2007 |
| WO | WO 2007/069474 A1 | 6/2007 |

OTHER PUBLICATIONS

Notice of Refusal dated Apr. 22, 2014, in Japanese Patent Application No. 2010-049762, with English translation.

Chinese Office Action and Search Report dated Oct. 24, 2014, for Chinese Application No. 201180009611.7.

* cited by examiner

CONVEYING AND COOLING APPARATUS FOR A RESIN COMPOSITION AND CONVEYING AND COOLING METHOD FOR A RESIN COMPOSITION

The present invention relates to a cooling apparatus and a cooling method.

BACKGROUND OF THE INVENTION

There is known a semiconductor package in which a semiconductor chip (semiconductor element) is covered (encapsulated) with a resin-made encapsulating (sealing) material. The encapsulating material for the semiconductor chip is produced by molding a resin composition through, e.g., a transfer molding method. In a process of producing the resin composition, the resin composition is molded into a sheet shape by pressurizing the resin composition between a pair of rollers and then the molded resin composition is cooled by a cooling apparatus (for example, see patent document 1).

The cooling apparatus in the document 1 comprises a conveyer belt which conveys a resin composition molded into a sheet shape and a duct having a plurality of nozzles which blow (discharge) cooling air to the resin composition on the conveyer belt. A temperature of the cooling air blown out from the nozzles is set in the range of 0 to 15° C. However, in such a temperature of the cooling air, it takes a long time to sufficiently cool the resin composition depending on a temperature of the resin composition just before being cooled by the cooling apparatus (for example, in the case where the temperature of the resin composition just before being cooled is in the range of 40 to 50° C.), that is, there is a problem in that a cooling efficiency of the resin composition is low.

Patent Document 1: JP-A 2006-297701.

It is an object of the present invention to provide a cooling apparatus and a cooling method, which can efficiently cool a resin composition.

The above object is achieved by the present invention which is specified in the following (1) to (16).

(1) A cooling apparatus comprising:
a conveying means which conveys a resin composition formed into a sheet shape along a direction parallel to a surface of the sheet shaped resin composition; and
a cooling means which cools the resin composition being conveyed by the conveying means,
wherein a temperature of the resin composition just before being cooled by the cooling means is in the range of 40 to 60° C., and
wherein the cooling means has a cooling ability to cool the resin composition such that a cooling rate of the resin composition is in the range of 0.2 to 5° C./min.

(2) The cooling apparatus described above (1), wherein the cooling means has a fan section having at least one outlet port which discharges cooling air of which temperature is in the range of −40 to 0° C. to the resin composition being conveyed.

(3) The cooling apparatus described above (2), wherein a humidity of the cooling air is equal to or less than 10%.

(4) The cooling apparatus described above (2) or (3), wherein when the cooling air is discharged from the outlet port, a pressure of the cooling air is equal to or higher than 0.2 MPa.

(5) The cooling apparatus described in any one of above (2) to (4), wherein the at, least one outlet port includes a plurality of outlet ports and the plurality of outlet ports are provided along a conveying direction of the resin composition.

(6) The cooling apparatus described in any one of above (2) to (5), wherein each outlet port discharges the cooling air to the resin composition from an upper side thereof.

(7) The cooling apparatus described in any one of above (2) to (5), wherein each outlet port discharges the cooling air to the resin composition from an opposite side with respect to the conveying direction of the resin composition.

(8) The cooling apparatus described in any one of above (2) to (7), wherein the cooling means is configured to discharge the cooling air to the resin composition from the both sides thereof.

(9) The cooling apparatus described in any one of above (2) to (8), wherein the cooling means is configured to gradually reduce the temperature of the cooling air.

(10) The cooling apparatus described in any one of above (1) to (9), wherein the conveying means has a pair of pulleys provided so as to be spaced apart from each other and a belt wrapped around the pair of pulleys, on which the resin composition is placed, conveying the resin composition by rotation of each of the pulleys, and
wherein at least a surface of the belt is constituted of a nonmetallic material.

(11) The cooling apparatus described above (10), wherein the belt is constituted of a laminated body and an outer layer positioned at an outermost side of the laminated body is constituted of a nonmetallic material.

(12) The cooling apparatus described in any one of above (1) to (11), further comprising a chamber containing both the resin composition and the belt therein and maintaining a cooling atmosphere obtained by the cooling means while the resin composition is conveyed by the belt.

(13) The cooling apparatus described in any one of above (1) to (12), wherein the resin composition is formed into a sheet shape by kneading the resin composition by a kneading device and then pressurizing the kneaded resin composition between a pair of rollers, and
wherein the cooling apparatus is provided at a downstream side of the pair of rollers from which the kneaded and pressurized resin composition is discharged.

(14) The cooling apparatus described in any one of above (1) to (13), wherein a thickness of the resin composition is equal to or less than 5 mm.

(15) The cooling apparatus described in any one of above (1) to (14), wherein the resin composition is used as a molding portion constituting an outer packaging of an IC package.

(16) A cooling method for cooling a resin composition formed into a sheet shape while conveying the resin composition along a direction parallel to a surface of the sheet shaped resin composition,
wherein a temperature of the resin composition just before being cooled by the cooling method is in the range of 40 to 60° C., and
wherein the resin composition is cooled such that a cooling rate of the resin composition is in the range of 0.2 to 5° C./min.

DETAILED DESCRIPTION OF THE PREFERRED EMBODIMENT

Hereinbelow, a cooling apparatus and a cooling method according to the present invention will be described in detail based on the preferred embodiments shown in the accompanying drawings.

First Embodiment

Figure 1:
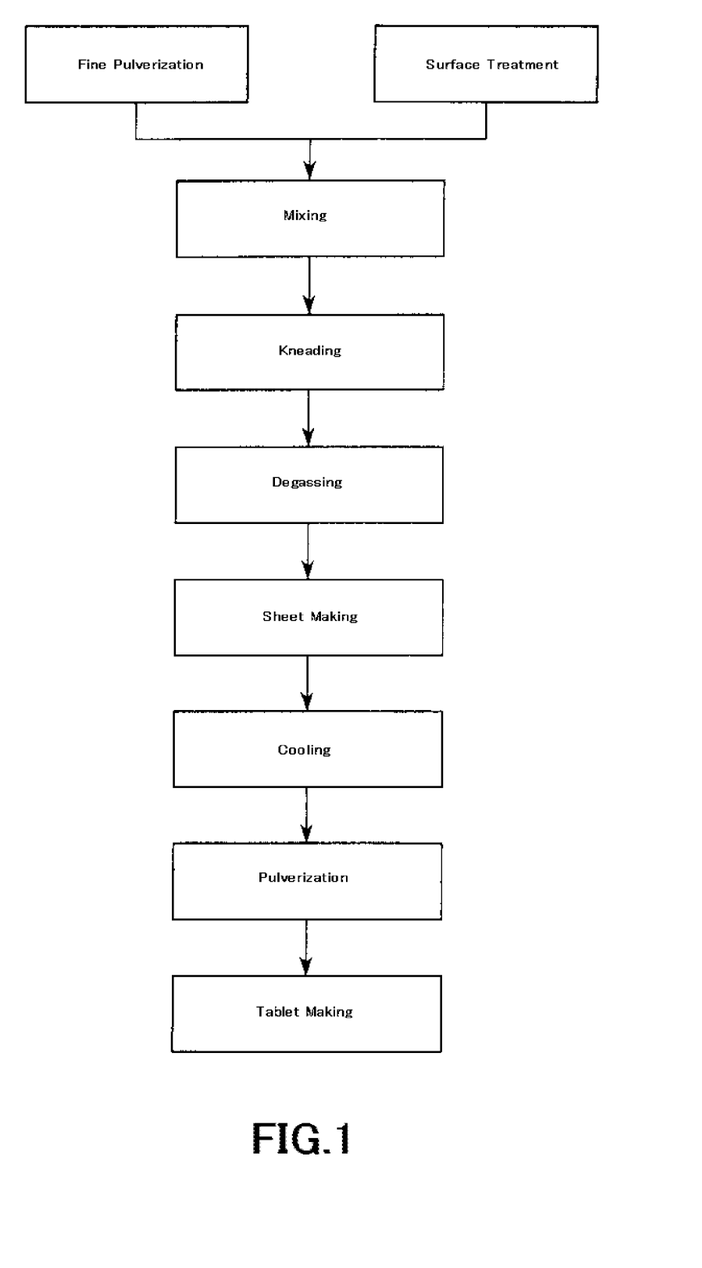
FIG. 1 is a process chart showing a producing process of a resin composition.
Figure 2:
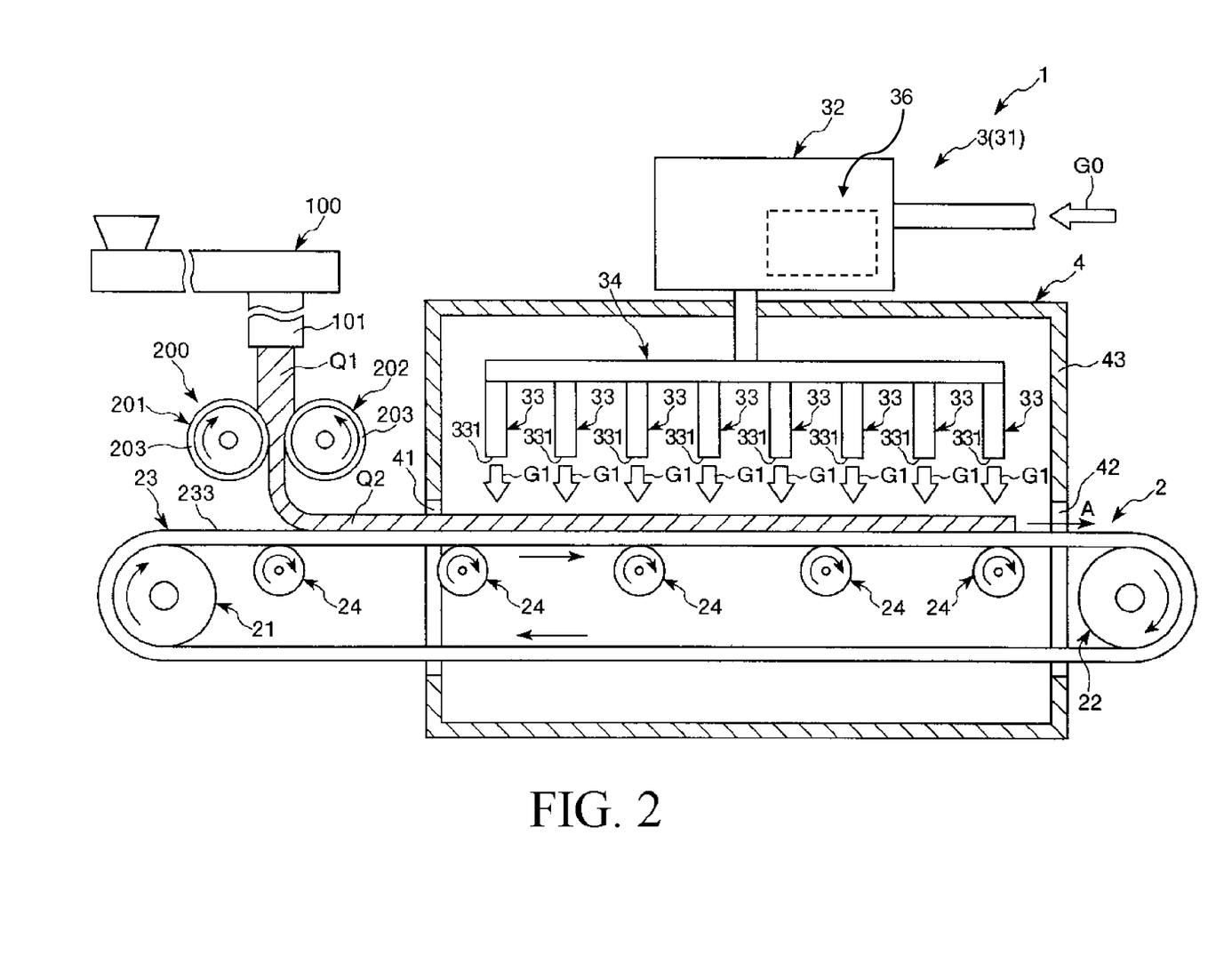
FIG. 2 is partial cross section view showing a cooling apparatus according to one embodiment of the present invention and peripheral apparatuses thereof.
Figure 3:
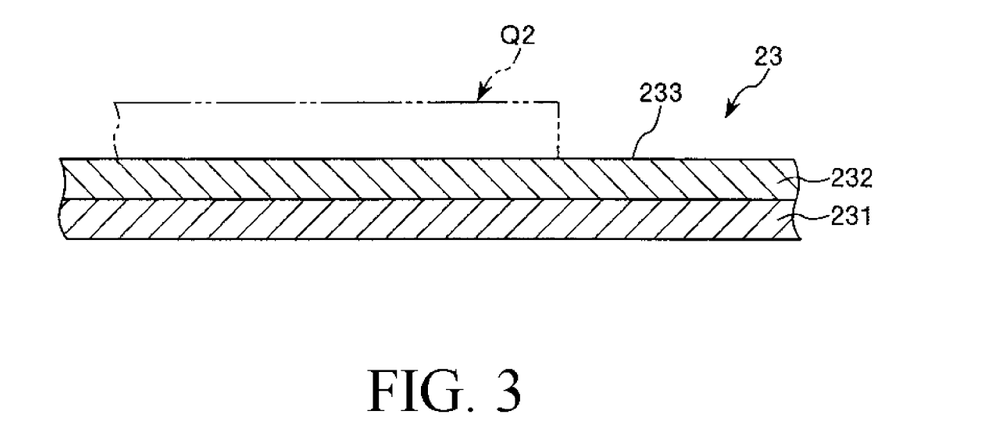
FIG. 3 is a longitudinal section view showing a belt of the cooling apparatus shown in FIG. 2.

FIG. 1 is a process chart showing a producing process of a resin composition. FIG. 2 is partial cross section view showing a cooling apparatus according to one embodiment of the present invention and peripheral apparatuses thereof. FIG. 3 is a longitudinal section view showing a belt of the cooling apparatus shown in FIG. 2. FIG. 7 is a partial section view showing an IC package using the resin composition. In the following description, the upper side in FIGS. 2, 3 and 7 will be referred to as "upper" or "upper side" and the lower side will be referred to as "lower" or "lower side". The same applies to FIGS. 4 to 6.

A cooling apparatus 1 shown in FIG. 2 is an apparatus used in a cooling process to produce a resin composition. The resin composition is finally molded into a molded body. Prior to describing the cooling apparatus 1, description will be first given to the overall producing process which begins with the supply of raw materials and ends with the production of the resin composition.

At first, individual materials as raw materials of the resin composition are prepared. The raw materials include a resin, a curing agent and a filler material (fine particle). If necessary, the raw materials may further include a curing accelerator and a coupling agent. It is preferable to use an epoxy resin as the resin.

Examples of the epoxy resin include a cresol novolac type resin, a biphenyl type epoxy resin, a dicyclopentadiene type epoxy resin, a triphenol methane type epoxy resin and a multi-ring aromatic type epoxy resin.

Examples of the curing agent include a phenol novolac type resin, a phenol aralkyl type resin, a triphenol methane type resin and a multi-ring aromatic resin.

Examples of the filler material include a fused silica (having a crushed shape or a spherical shape), a crystalline silica and an alumina.

Examples of the curing accelerator include a phosphor compound and an amine compound. Examples of the coupling agent include a silane compound and so forth.

Specific one of the materials stated above may be excluded from the raw materials. Other materials than set forth above may be further included in the raw materials. Examples of the other materials include a coloring agent, a releasing agent, a flame retardant and a stress-reducing agent.

(Fine Pulverization)

As shown in FIG. 1, specific materials among the raw materials are first pulverized (finely pulverized) by a first pulverizing device to have a specified particle size distribution. Examples of the raw materials to be pulverized include the resin, the curing agent, the curing accelerator and other materials than the filler material. A part of the filler material may be added into the raw materials to be pulverized. As the first pulverizing device, it is possible to use a continuous rotary ball mill and so forth.

(Surface Treatment)

A specified material among the raw materials, for example, all or a part (remaining part) of the filler material, is subjected to a surface treatment. In the surface treatment, for example, the coupling agent adheres to a surface of the filler material. The fine pulverization and the surface treatment may be performed either simultaneously or one after the other.

(Mixing)

Next, a composition containing the above raw materials is thoroughly mixed by a mixing device. As the mixing device, it is possible to use, for example, a high-speed mixing device having a rotating blade.

(Kneading)

Next, the mixed composition is kneaded by a kneading device 100. As the kneading device 100, it is possible to use, a kneading extruder such as a single-axis type kneading extruder or a double-axis type kneading extruder, or a roll type kneader such as a mixing roll and so forth.

(Degassing)

Next, the mixed composition thus kneaded (resin composition) is degassed by a degassing device. This degassing process can be performed by a vacuum pump (not shown) connected with a discharge passage 101 of the kneading device 100. The discharge passage 101 of the kneading device 100 discharges the resin composition thus kneaded.

(Sheet Making)

Next, the massive resin composition thus degassed (hereinbelow referred to as "kneaded composition Q1") is molded into a sheet shape by a molding device 200. As a result, a sheet shaped composition (sheet shaped material, hereinbelow referred to as "sheet shaped material Q2") is obtained. As the molding device, it is possible to use, e.g., a device having rollers 201, 202 each provided at a lower side (downstream side) of the discharge passage 101 of the kneading device 100 shown in FIG. 2. In the device shown in FIG. 2, the kneaded composition Q1 discharged from the kneading device 100 is molded into a sheet shape by pressurizing the kneaded composition between rollers 201, 202.

(Cooling)

Next, the sheet shaped material Q2 is cooled by a cooling apparatus 1. This makes it possible to easily and reliably perform pulverization of the sheet shaped material Q2. The cooling apparatus 1 will be described later.

(Pulverization)

Next, the sheet shaped material Q2 is pulverized by a second pulverizing device to have a specified particle size distribution. As a result, a pulverized composition is obtained. As the second pulverizing device, it is possible to use a hammer mill, a grindstone type mill or a roll crusher.

(Tablet Making)

Next, the pulverized composition is compression-molded by a compact manufacturing device (tablet-making device) to obtain a resin composition in the form of compacts.

As shown in FIG. 7, the resin composition is used for, for example, covering (encapsulating) a semiconductor chip (IC chip) 901. And the resin composition is used as a molding portion 902 constituting an outer packaging of a semiconductor package (IC package) 900. This makes it possible to protect the semiconductor chip 901 with the molding portion 902. In order to cover the semiconductor chip 901 with the resin composition, the resin composition is molded by a transfer molding method and so forth, and then the semiconductor chip 901 is covered with the resin composition. The semiconductor package 900 shown in FIG. 7 has plural lead frames 903 protruding from the molding portion 902. Each of the lead frames 903 is electrically connected with the semiconductor chip 901 through a wire 904 constituted of a metallic material having conductive property, such as gold and so forth.

The tablet-making step may be omitted and the powdery resin composition may be used as final products. In this case, encapsulating material can be formed by, e.g., a compression-molding method or an injection-molding method.

Next, description will be given to the cooling apparatus 1. The cooling apparatus 1 shown in FIG. 2 is an apparatus for performing a cooling method of the present invention. The cooling apparatus 1 is provided at a lower side of the rollers 201, 202, that is, a downstream side of the rollers 201, 202 to which the sheet shaped material Q2 is discharged from between the rollers 201, 202. This makes it possible for the sheet shaped material Q2 to be quickly transferred to the cooling apparatus 1. And then, the cooling apparatus 1 can cool the sheet shaped material Q2 while conveying the sheet shaped material Q2 to the next process. An object to cool the sheet shaped material Q2 is as follows.

The sheet shaped material Q2 which has been just discharged from between the rollers 201, 202 is heated and a temperature of the sheet shaped material Q2 just before being cooled is, for example, in the range of about 40 to 60° C. For this reason, the sheet shaped material Q2 becomes soft. Further, since the sheet shaped material Q2 is pulverized in the pulverization process which is the next process after the cooling process, there is need to make the sheet shaped material Q2 hardened by cooling it for the purpose of performing the reliable pulverization of the sheet shaped material Q2. This is the object to cool the sheet shaped material Q2.

As shown in FIG. 2, the cooling apparatus 1 has a conveying means (conveying device) 2 for conveying the sheet shaped material Q2, a cooling means (cooling device) 3 for cooling the sheet shaped material Q2, and a chamber 4 maintaining a cooling atmosphere obtained by the cooling means 3. Hereinbelow, description will be given to each component constituting the cooling apparatus 1.

The conveying means 2 is a conveyor belt which conveys the sheet shaped material Q2 along a direction parallel to a surface thereof and send it out to the next process. The conveying means 2 has a driving pulley (carry roller) 21, a driven pulley (return roller) 22, a belt 23 wrapped around the driving pulley 21 and the driven pulley 22, and plural idle pulleys (conveyer belt rollers) 24 provided between the driving pulley 21 and the driven pulley 22.

The driving pulley 21 and the driven pulley 22 are arranged so as to be spaced apart from each other through the chamber 4. The driving pulley 21 is connected with a motor (not shown) and can rotate by driving the motor. Further, when the driving pulley 21 rotates, a torque of the driving pulley 21 is transmitted to the driven pulley 22 through the belt 23 so that the driven pulley 22 can be rotated together with the driving pulley 21.

The belt 23 has flexibility and is configured to convey the sheet shaped material Q2 placed thereon by the rotation of each of the driving pulley 21 and the driven pulley 22. For example, in the configuration shown in FIG. 3, the belt 23 is constituted of a laminated body having a foundation layer 231 and an outer layer 232.

The foundation layer 231 is made of, for example, a steel and is a part constituting a core of the belt 23.

The outer layer 232 is formed on the foundation layer 231 and positioned at an outermost side of the belt 23, on which the sheet shaped material Q2 is placed. Further, the outer layer 232 is preferably constituted of a nonmetallic material. In a case in which the outer layer 232 is constituted of the nonmetallic material, even if fragments of an outer peripheral surface 233 of the outer layer 232 are produced by friction between the sheet shape material Q2 and the outer peripheral surface 233 of the outer layer 232 during the sheet shaped material Q2 being conveyed, the fragments of the outer peripheral surface 233 are obviously constituted of the nonmetallic material. In contrast, in a case in which the outer peripheral surface 233 of the outer layer 232 is constituted of the steel, if pulverized metals are produced by the friction between the sheet shape material Q2 and the outer peripheral surface 233 of the outer layer 232 during the sheet shaped material Q2 being conveyed, the pulverized metals are mixed into the sheet shaped material Q2 which has not yet been sufficiently cooled and is in a softening state. However, in the cooling apparatus 1, it is possible to prevent the pulverized metals from being mixed into the sheet shaped material Q2. In addition, even if the fragments are mixed into the sheet shaped material Q2, the sheet shaped material Q2 has satisfactory properties for using as the molding portion 902 of the semiconductor package 900 because the fragments are constituted of the nonmetallic material.

The nonmetallic material is not particularly limited to a specific material. Examples of the nonmetallic material include various types of rubber such as an isoprene rubber, a butadiene rubber and a styrene-butadiene rubber and various types of thermoplastic elastomer such as a styrene-based elastomer, a polyolefin-based elastomer, a polyvinyl chloride-based elastomer and a polyurethane-based elastomer. These materials may be used singly or in combination of two or more of them.

Further, the foundation layer 231 may be coated by ceramic material instead of providing the outer layer 232 made of such elastic material above on the foundation layer 231. In this case, examples of the ceramic material include an oxide ceramic such as an alumina, a silica, a titania, a zirconia, a yttria or a calcium phosphate, a nitride ceramic such as a silicon nitride, an aluminum nitride, a titanium nitride or a boron nitride, a carbide ceramic such as a tungsten carbide or the like, and a composite ceramic containing a combination of two or more of the above ceramic materials. Among the above ceramic materials, it is preferable to use a ceramic material containing the oxide ceramic.

Further, an outer layer 203 of the roller 201 and an outer layer 203 of the roller 202 which are provided at an upstream side of the cooling apparatus 1 are preferably constituted of a ceramic material. This makes it possible to reliably prevent the pulverized metals from being mixed into the sheet shaped material Q2.

The conveyer belt rollers 24 are respectively arranged at equal intervals between the driving pulley 21 and the driven pulley 22 and support an upper side portion of the belt 23. This makes it possible to be smoothly driven and to prevent the belt 23 from being strained (strain of the belt 23).

The cooling means 3 is configured to cool the sheet shaped material Q2 being conveyed by the conveying means 2. The cooling means 2 has a cooling ability to cool the sheet shaped material Q2 such that a cooling rate of the sheet shaped material Q2 is in the range of 0.2 to 5° C./min, and preferably in the range of 0.5 to 1.5° C./min. In the cooling means 3, each component constituting the cooling means 3 and cooling condition thereof are set as follows to obtain (exert) the cooling ability of the cooling means 3.

As shown in FIG. 2, the cooling means 3 has a fan section 31 for blowing (discharging) cooling air G1 to the sheet shaped material Q2. The cooling means 3 (the fan section 31) has a cooling air generation section 32 for generating the cooling air G1, plural nozzles 33 for discharging the cooling air G1 generated in the cooling air generation section 32 and a conduit line 34 connecting the cooling air generation section 32 with the plural nozzles 33.

The cooling air generation section 32 is arranged at an outside of the chamber 4. The cooling air generation section 32 is a device which cools a high-pressure gas G0 injected therein to thereby generate the cooling gas G1 from the high-pressure gas G0. A configuration to cool the high-pressure gas G0 is not particularly limited to a specific configuration, but it is possible to use a configuration to cool the high-pressure gas G0 by a coolant such as liquid nitrogen. Further, as the other configuration to cool the high-pressure gas G0, it is possible to use a heat pump type refrigerator. The heat pump type refrigerator is not limited to a specific type, but examples of the heat pump type refrigerator include a vapor compression type refrigerator, an absorption type refrigerator, an adsorption type refrigerator, a Stirling type refrigerator, a chemical reaction type refrigerator and a semiconductor refrigerator.

The high-pressure gas G0 is not particularly limited to a specific gas. Examples of the high-pressure gas include air, carbon dioxide and inactive gas such as nitrogen. From a viewpoint of safety, it is preferably to use air as the high-pressure gas G0.

The plural nozzles 33 are respectively arranged in an inside of the chamber 4 along the conveying direction A of the sheet shaped material Q2. In this regard, the plural nozzles 33 may be arranged in a direction of a width of the sheet shaped material Q2 (in a backside direction of FIG. 2). Hereinbelow, since structures of the plural nozzles 33 are substantially identical to each other, one of the nozzles 33 will be representatively described.

The nozzle 33 is constituted of a conduit and is arranged such that an opening at one end of the conduit faces to the lower side, that is, a side of the belt 23. The opening of the conduit serves as an outlet port 331 which discharges the cooling air G1. This makes it possible to discharge the cooling air G1 to the sheet shaped material Q2 from an upper side thereof when the sheet shaped material Q2 passes through the lower side of the nozzle 33. Further, since the plural nozzles 33 are respectively arranged along the conveying direction A of the sheet shaped material Q2, the sheet shaped material Q2 is contacted with the cooling air G1 during the sheet shaped material Q2 being conveyed. This makes it possible to reliably and rapidly cool the sheet shaped material Q2 appropriately.

Further, a temperature of the cooling air G1 discharged from the nozzle 33 is not particularly limited to a specific value, but is preferably set in the range of −40 to 0° C., and more preferably set in the range of −20 to −30° C. The temperature of the cooling air G1 is set by, e.g., a method in which a flow rate of the high-pressure gas G0 per unit of time when passing through the coolant is adjusted, an adjustment of a setting temperature of the refrigerator and so forth.

Further, a humidity of the cooling air G1 discharged from the nozzle 33 is not particularly limited to a specific value, but is preferably set equal to or less than 10% and more preferably in the range of 0 to 5%. This makes it possible to cool the sheet shaped material Q2 under a condition below dew point to thereby prevent dew condensation formed on the sheet shaped material Q2. The humidity of the cooling air G1 is set by, e.g., a method in which a dehumidification agent is provided in the cooling air generation section 32 so that the high-pressure gas G0 passes through the dehumidification agent or a method providing a dehumidification device 36 such as dryer with the cooling means 3.

Further, a pressure of the cooling air G1 when the cooling air G1 is discharged from the nozzle 33 is not particularly limited to a specific value, but is preferably set equal to or higher than 0.2 MPa, and more preferably set in the range of 0.3 to 0.5 MPa. The pressure of the cooling air G1 is set by, e.g., a method in which a valve is provided with the cooling air generation section 32 and by adjusting opening and closing condition of the valve, a pressure (flow rate) of the high-pressure gas G0 passing through the valve is adjusted.

According to the configuration of the cooling apparatus 1 and the cooling condition as set forth above, the sheet shaped material Q2 is reliably cooled at the above cooling rate. This makes it possible to efficiently cool the sheet shaped material Q2 of which temperature just before being cooled is in the range of 40 to 50° C. Therefore, before the sheet shaped material Q2 is transferred to the pulverization process, it is possible to reliably and rapidly transform the softened sheet shaped material Q2 into the hardened sheet shaped material Q2. As a result, the hardened sheet shaped material Q2 can be easily and reliably pulverized in the pulverization process.

Further, since the sheet shaped material Q2 can be efficiently cooled, that is, can be cooled in a short time in the cooling apparatus 1, it is possible to prevent the belt 23 from being excessively lengthened to sufficiently contact the sheet shaped material Q2 with the cooling air G1. This makes it possible for the cooling apparatus 1 to be miniaturized.

Further, a thickness of the sheet shaped material Q2 is preferably equal to or less than 5 mm, and more preferably in the range of 0.5 to 3 mm. This makes it possible to more efficiently cool the sheet shaped material Q2 by the cooling apparatus 1.

Furthermore, it is preferred that the molding device 200 has a function to cool the sheet shaped material Q2. This makes it possible to precool the sheet shaped material Q2 before being cooled by the cooling apparatus 1 to thereby more efficiently cool the sheet shaped material Q2 by the cooling apparatus 1.

As shown in FIG. 2, the chamber 4 can contain both the sheet shaped material Q2 and the belt 23 therein while the sheet shaped material Q2 is conveyed by the belt 23. Further, the chamber 4 has an inlet port 41 from which the sheet shaped material Q2 is introduced and an outlet port from which the sheet shaped material Q2 is discharged. The sheet shaped material Q2 being conveyed by the belt 23 is introduced into the chamber 4 via the inlet port 41, and cooled in the chamber 4 by the cooling means 3, and then discharged from the outlet port 42.

Since a cooling atmosphere obtained by the cooling means 3 is maintained in the chamber 4, it is possible to efficiently cool the sheet shaped material Q2. Further, this makes it possible to prevent a foreign substance from being mixed into the sheet shaped material Q2.

Wall portions 43 of the chamber 4 are preferably covered with a thermal insulating material or has the thermal insulating material embedded therein.

Second Embodiment

Figure 4:
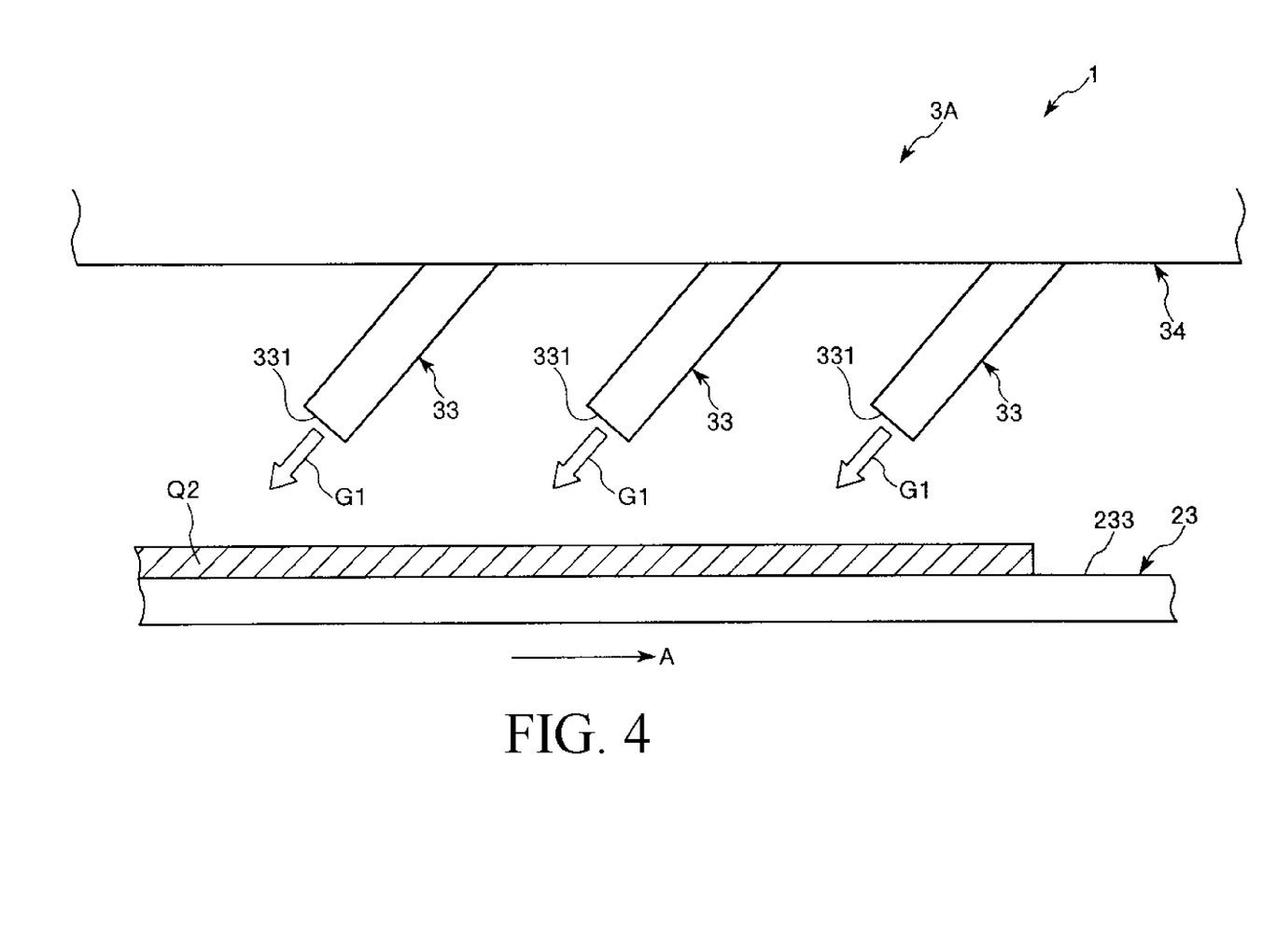
FIG. 4 is a partial cross section view showing a cooling apparatus according to a second embodiment of the present invention.

FIG. 4 is partial cross section view showing a cooling apparatus according to a second embodiment of the present invention.

Hereinbelow, the second embodiment of the cooling apparatus and the cooling method will be described by placing emphasis on the points differing from the first embodiment of the cooling apparatus and the cooling method, with the same matters omitted from description.

The cooling apparatus and the cooling method according to the second embodiment are the same as the cooling apparatus and the cooling method according to the first embodiment, except the configuration of the cooling means.

A cooling means 3A shown in FIG. 4 has plural nozzles 33 each arranged so as to be inclined toward a downstream side of the conveying direction A. In this configuration, the cooling air G1 is discharged from the opposite side with respect to the conveying direction A. Namely, a flow direction of the cooling air G1 is a counter flow.

According to the second embodiment of the present invention, the cooling apparatus 1 has an cooling efficiency equivalent to or more than that of the first embodiment in which the cooling air G1 is discharged to the sheet shaped material Q2 from the vertically upper side thereof.

Third Embodiment

Figure 5:
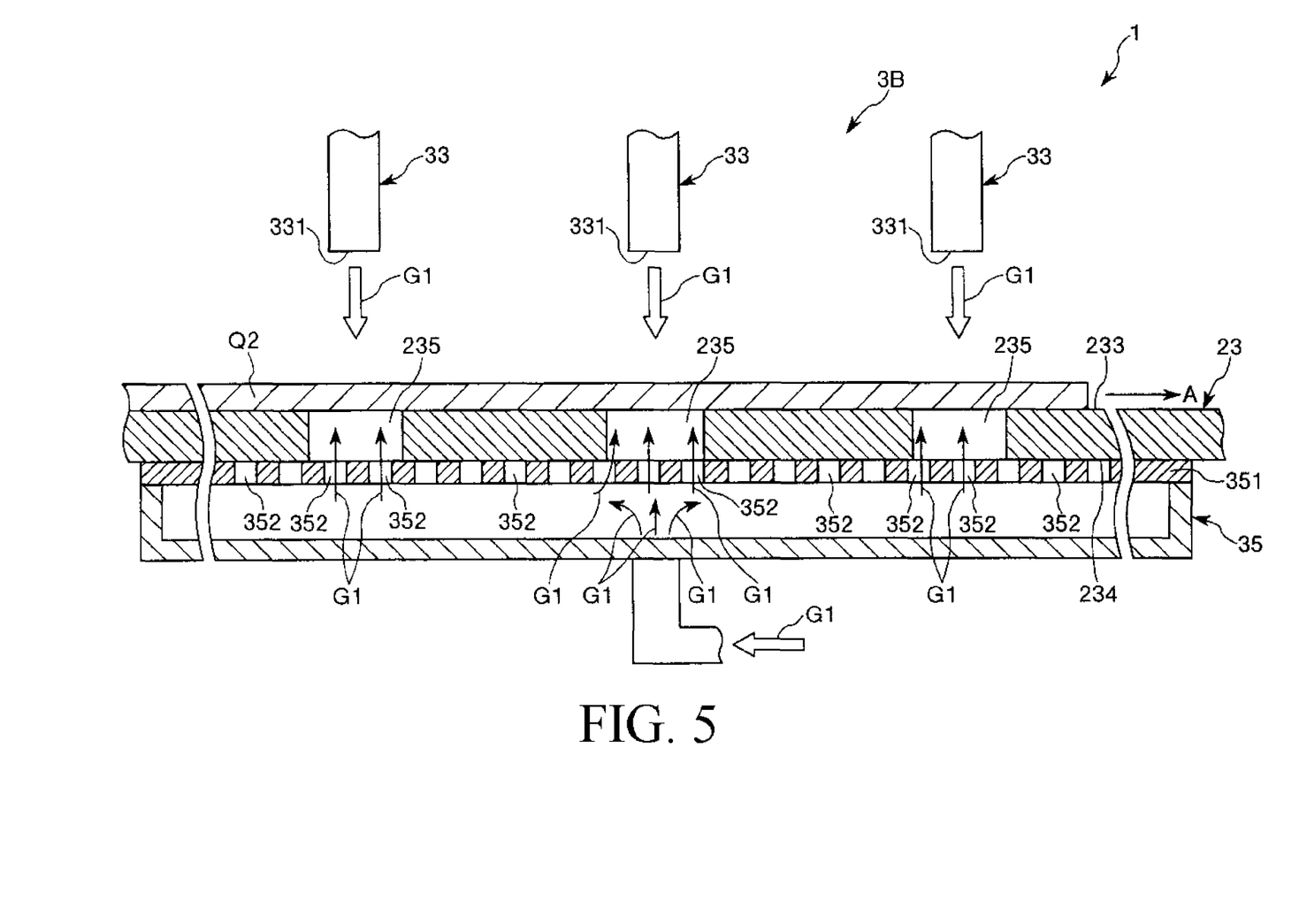
FIG. 5 is a partial cross section view showing a cooling apparatus according to a third embodiment of the present invention.

FIG. 5 is a partial cross section view showing a cooling apparatus according to a third embodiment of the present invention.

Hereinbelow, the third embodiment of the cooling apparatus will be described by placing emphasis on the points differing from the first and second embodiments of the cooling apparatus and the cooling method, with the same matters omitted from description.

The cooling apparatus and the cooling method according to the third embodiment are the same as the cooling apparatus and the cooling method according to the first embodiment, except the configuration of the cooling means.

A cooling means 3B shown in FIG. 5 is configured to discharge the cooling air G1 to the sheet shaped material Q2 from both sides thereof. Hereinbelow, this configuration of the cooling means 3B will be described.

In the cooling means 3B, a retention unit 35 communicating with the cooling air generation section 32 is provided at the opposite side of the nozzles 33 through the belt 23 in addition to the plural nozzles 33. The retention unit 35 is configured to once store the cooling air G1 from the cooling air generation section 32 therein.

The retention unit 35 is formed into a box shape and an upper side thereof is constituted of, e.g., a packing 351 made of an elastic material. The packing 351 is formed into a plate shape and many through holes 352 which pass through the packing 351 in a thickness direction thereof are formed therein. Further, the packing 351 contacts an inner surface 234 of the belt 23.

On the other hand, many through holes 235 which pass through the belt 23 in a thickness direction thereof are formed therein. A size of each of the through holes 235 of the belt 23 is larger than that of each of the through holes 352 of the packing 351.

When the belt 23 is driven and a specified through hole 235 of the belt 23 communicates any one of the through holes 352 of the packing 351, the cooling air G1 is discharged from the specified through hole 235. The cooling gas G1 discharged from the specified through hole 235 can cool the sheet shaped material Q2 from the lower side thereof. Further, as set forth above, the cooling air G1 discharged from the nozzles 33 can cool the sheet shaped material Q2 from the upper side thereof.

According to the third embodiment of the present invention, it is possible for a contact area of the sheet shaped material Q2 with the cooling air G1 to become large, thereby obtaining high cooling efficiency. Further, since the sheet shaped material Q2 is cooled from both sides thereof, it is possible to prevent warpage of the sheet shaped material Q2 from being formed during the cooling of the sheet shaped material Q2. This makes it possible to prevent clogging from being generated by contacting the sheet shaped material Q2 with the nozzle 33 during the cooling of the sheet shaped material Q2.

Fourth Embodiment

Figure 6:
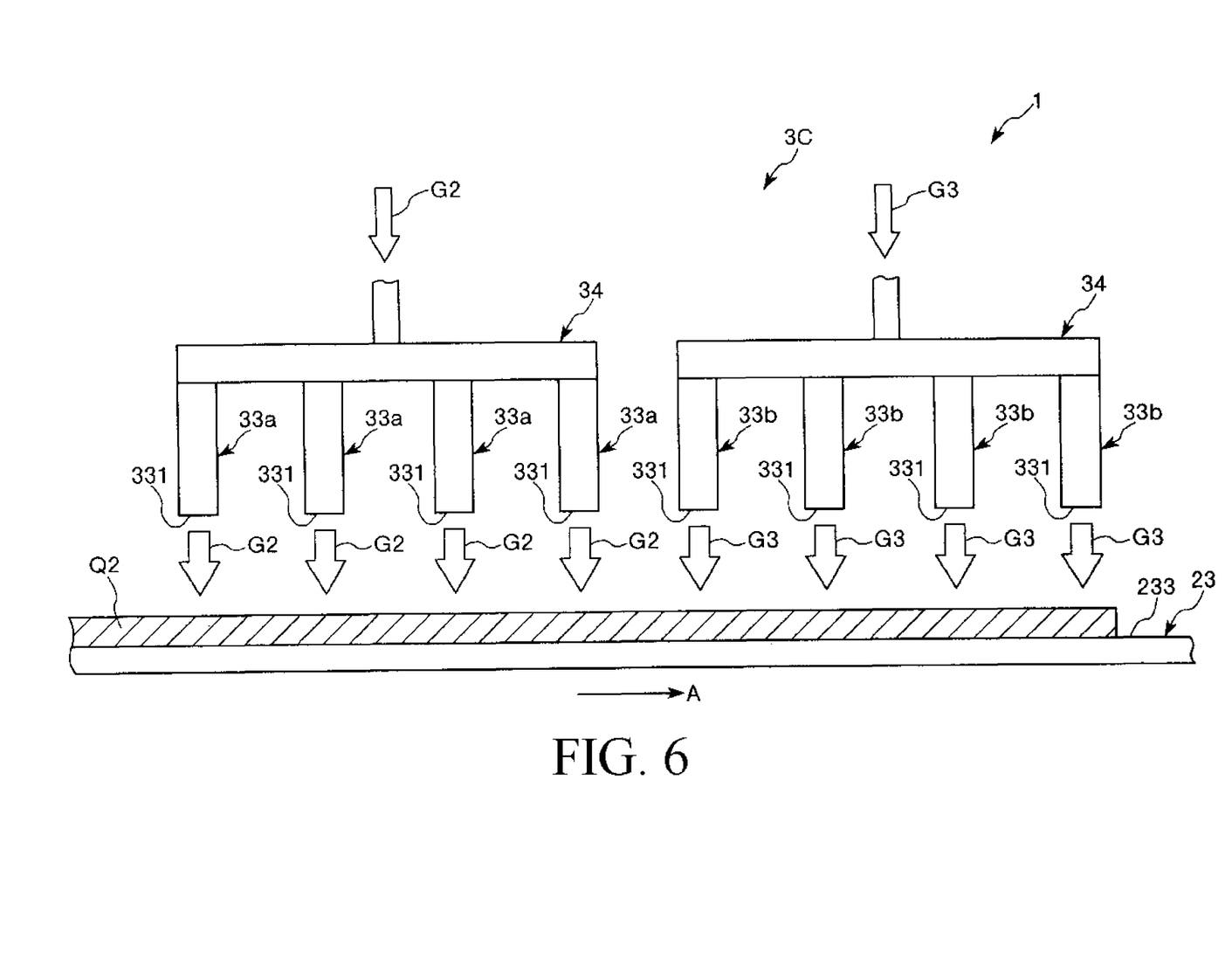
FIG. 6 is a partial cross section view showing a cooling apparatus according to a fourth embodiment of the present invention.
Figure 7:
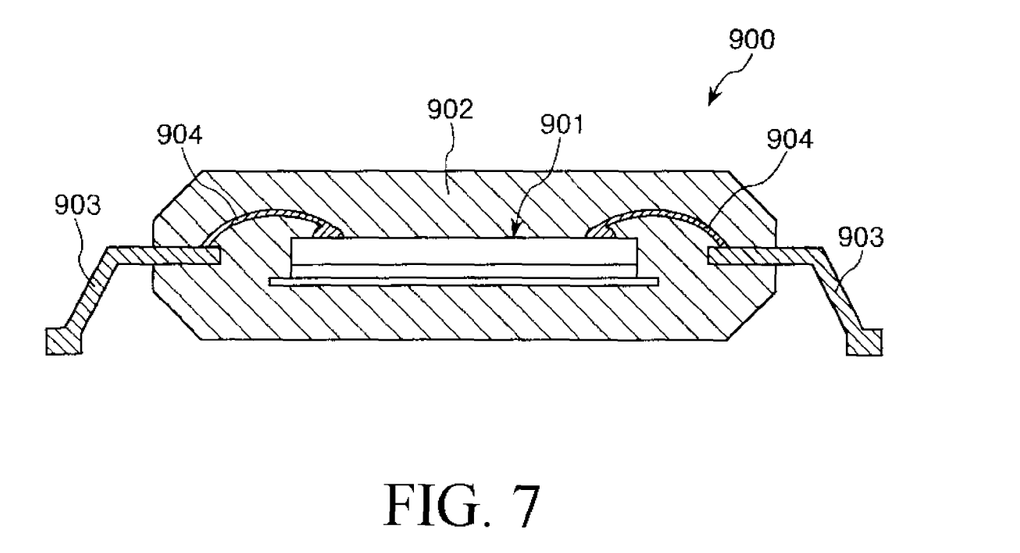
FIG. 7 is a partial section view showing an IC package using the resin composition.

FIG. 6 is a partial cross section view showing a cooling apparatus according to a fourth embodiment of the present invention.

Hereinbelow, the fourth embodiment of the cooling apparatus and the cooling method will be described by placing emphasis on the points differing from the first, second and third embodiments of the cooling apparatus and the cooling method, with the same matters omitted from description.

The cooling apparatus and the cooling method according to the fourth embodiment are the same as the cooling apparatus and the cooling method according to the first embodiment, except the configuration of the cooling means.

A cooling means 3C shown in FIG. 6 has nozzles 33a and nozzles 33b for discharging the cooling air G2 and the cooling air G3 respectively. The temperature of the cooling air G2 discharged from the nozzles 33a is different from the temperature of the cooling air G3 discharged from the nozzles 33b. For example, the temperature of the cooling air G2 is set to be higher than the temperature of the cooling air G3. In this case, it is possible to set the temperature of the cooling air G2 in the range of $-20$ to $0°$ C. and the temperature of the cooling air G3 in the range of $-40$ to $-20°$ C., respectively. Further, one chamber 4 for maintaining a cooling atmosphere obtained by the cooling air G2 and another chamber 4 for maintaining a cooling atmosphere obtained by the cooling air G3 may be provided in the cooling apparatus 1.

In this configuration, the sheet shaped material Q2 is gradually cooled during the sheet shaped material Q2 being conveyed. This makes it possible to prevent the sheet shaped material Q2 from being drastically cooled. As a result, an involuntary deterioration of the sheet shaped material Q2 can be prevented. Further, this makes it possible to prevent clogging from being generated by contacting the sheet shaped material Q2 with the nozzle 33 during the cooling of the sheet shaped material Q2. Generally, the cooling effect is affected to a temperature difference between a substance being cooled and a coolant. Therefore, in this configuration, since the sheet shaped material Q2 is cooled under appropriate low temperature condition, there is no loss of energy efficiency.

While the descriptions are given to the cooling apparatus according to the present invention shown in the drawings, the present invention is not limited thereto. Each component constituting the cooling apparatus may be substituted for an arbitrary component having the same function as it. Further, arbitrary structures also may be added thereto.

Further, the cooling apparatus of the present invention may be made by combining two or more of the arbitrary structures (features) in one of the embodiments described above.

Further, while the belt of the cooling apparatus according to the present invention is constituted of the laminated body and the outer layer (outermost layer) is constituted of the nonmetallic material such as an elastic material, the present invention is not limited thereto. The belt may be constituted of a single layer and whole of the belt is made of the nonmetallic material.

Further, while the cooling means of the cooling apparatus according to the present invention has the plural nozzles, the present invention is not limited thereto. Only one nozzle may be provided in the cooling means.

INDUSTRIAL APPLICABILITY

With the present invention, it is possible to efficiently cool the resin composition of which temperature is in the range of 40 to 50° C. Therefore, in the case where the resin composition which is soft in the range of 40 to 50° C. is to be pulverized, it is possible to reliably and rapidly transform the soft resin composition into the hard resin composition by cooling it using the cooling apparatus before the resin composition is pulverized. As a result, the hard resin composition can be easily and reliably pulverized in the pulverization process.

Further, with the present invention, the conveying means has the belt conveying the resin composition on which the resin composition is placed and at least a surface of the belt is constituted of the nonmetallic material. In this configuration, even if fragments of the surface of the belt are produced by friction between the resin material and the surface of the belt during the resin composition being conveyed, the fragments of the surface are obviously constituted of the nonmetallic material. In contrast, in a case in which the whole belt is constituted of the steel, if pulverized metals are produced by the friction between the resin composition and the belt during the resin composition being conveyed, the pulverized metals are mixed into the resin composition which has not yet been sufficiently cooled and is in a softening state. However, according to the present invention, it is possible to prevent the pulverized metals from being mixed into the resin composition. In addition, even if the fragments are mixed into the resin composition, the resin composition has satisfactory properties because the fragments are constituted of the nonmetallic material. For the reasons stated above, the present invention is industrially applicable.

What is claimed is:

1. An apparatus comprising:
    a kneading device which kneads a resin composition;
    a pair of rollers which pressurizes the kneaded resin composition to thereby form the resin composition into a sheet-shaped resin composition, each roller having an outer layer constituted of a ceramic material;
    a conveying device which conveys the sheet-shaped resin composition along a direction parallel to a surface thereof; and
    a cooling device which cools the sheet-shaped resin composition being conveyed by the conveying device,
    wherein a temperature of the sheet-shaped resin composition just before being cooled by the cooling device is in the range of 40 to 60° C.,
    wherein the cooling device has at least one outlet port which discharges cooling air of −40 to 0° C. to the sheet-shaped resin composition being conveyed and a dehumidification device which is provided and in line with the cooling device, wherein the cooling air which is dehumidified is at an upstream side of the at least one outlet port, wherein said dehumidification device dehumidifies the cooling air in the cooling device, and
    wherein the cooling device is configured to discharge the cooling air which is dehumidified by the dehumidification device to the sheet-shaped resin composition from the at least one outlet port to thereby have a cooling ability to cool the resin composition such that a cooling rate of the sheet-shaped resin composition is in the range of 0.2 to 5° C./sec.

2. The apparatus as claimed in claim 1, wherein the humidity of the cooling air is equal to or less than 10%.

3. The apparatus as claimed in claim 1, wherein when the cooling air is discharged from the outlet port, a pressure of the cooling air is equal to or higher than 0.2 MPa.

4. The apparatus as claimed in claim 1, wherein the at least one outlet port includes a plurality of outlet ports and the plurality of outlet ports are provided along a conveying direction of the sheet-shaped resin composition.

5. The apparatus as claimed in claim 1, wherein the at least one outlet port discharges the cooling air to the sheet-shaped resin composition from an upper side thereof.

6. The apparatus as claimed in claim 1, wherein the at least one outlet port discharges the cooling air to the sheet-shaped resin composition from an opposite side with respect to a conveying direction of the sheet-shaped resin composition.

7. The apparatus as claimed in claim 1, wherein the cooling device is configured to discharge the cooling air to the sheet-shaped resin composition from an upper side and a lower side thereof.

8. The apparatus as claimed in claim 4, wherein a temperature of the cooling air discharged from a first outlet port of the plurality of outlet ports provided at a downstream side of the conveying device is lower than a temperature of the cooling air discharged from a second outlet port of the plurality of outlet ports provided at an upstream side of the conveying device compared to the first outlet port.

9. The apparatus as claimed in claim 1,
    wherein the conveying device has a pair of pulleys arranged so as to be spaced apart from each other and a belt wrapped around the pair of pulleys, on which the sheet-shaped resin composition is placed, conveying the sheet-shaped resin composition by rotation of each of the pulleys, and
    wherein at least a surface of the belt is constituted of a nonmetallic material.

10. The apparatus as claimed in claim 9, wherein the belt is constituted of a laminated body and an outer layer positioned at an outermost side of the laminated body is constituted of a nonmetallic material.

11. The apparatus as claimed in claim 1,
    further comprising a chamber containing both the sheet-shaped resin composition and a belt therein and maintaining a cooling atmosphere obtained by the cooling device while the sheet-shaped resin composition is conveyed by the belt.

12. The apparatus as claimed in claim 1, wherein a thickness of the sheet-shaped resin composition is equal to or less than 5 mm.

13. A conveying and cooling method for cooling a resin composition molded into a sheet shape while conveying the resin composition along a direction parallel to a surface of the sheet-shaped resin composition by using the apparatus of claim 1, the method comprising:
   conveying the sheet-shaped resin composition along the direction parallel to the surface thereof by using the conveying device, and
   cooling the sheet-shaped resin composition being conveyed by the conveying device by using the cooling device,
   wherein a temperature of the sheet-shaped resin composition just before being cooled by the cooling method is in the range of 40 to 60° C., and
   wherein the resin composition is cooled such that a cooling rate of the sheet-shaped resin composition is in the range of 0.2 to 5° C./sec by the cooling device.

14. The apparatus as claimed in claim 1,
   wherein the cooling device has a retention unit storing the cooling air therein which is provided at an opposite side of the at least one outlet port through the conveying device, and
   wherein the retention unit is configured to cool an underside of the sheet-shaped resin composition.

\* \* \* \* \*